United States Patent
Dornel

(10) Patent No.: US 8,735,959 B2
(45) Date of Patent: May 27, 2014

(54) NON-VOLATILE MEMORY DEVICE FORMED BY DUAL FLOATING GATE DEPOSIT

(71) Applicant: International Business Machines Corporation, Armonk, NY (US)

(72) Inventor: Erwan Dornel, Fontaine (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/079,981

(22) Filed: Nov. 14, 2013

(65) Prior Publication Data

US 2014/0061760 A1 Mar. 6, 2014

Related U.S. Application Data

(62) Division of application No. 13/456,456, filed on Apr. 26, 2012.

(51) Int. Cl.
*H01L 29/76* (2006.01)
*H01L 29/788* (2006.01)

(52) U.S. Cl.
USPC .............. 257/314; 257/315; 257/E29.129; 257/E29.3

(58) Field of Classification Search
USPC .......... 257/314, 315, 317, 319, 320, E29.129, 257/E29.3
See application file for complete search history.

(56) References Cited

U.S. PATENT DOCUMENTS

| | | | |
|---|---|---|---|
| 6,376,877 B1 | 4/2002 | Yu et al. | |
| 6,589,840 B2 | 7/2003 | Tseng | |
| 6,682,977 B2 | 1/2004 | Chang | |
| 7,045,852 B2 | 5/2006 | Van Duuren et al. | |
| 8,258,569 B2 * | 9/2012 | Hatakeyama et al. | 257/319 |
| 8,278,202 B2 | 10/2012 | Hendricks et al. | |
| 2004/0197992 A1 | 10/2004 | Yang | |
| 2007/0047304 A1 | 3/2007 | Lee et al. | |
| 2011/0031549 A1 | 2/2011 | Kondo et al. | |
| 2011/0111583 A1 | 5/2011 | Chien et al. | |

OTHER PUBLICATIONS

C. Ludwig, et al., "Advances in Flash Memory Devices," Materials Science-Poland, vol. 28, No. 1, 2010; pp. 105-115.
T. Ohbaa, et al., "A Novel Tri-Control Gate Surrounding Gate Transistor (TCG-SGT) Nonvolatile Memory Cell for Flash Memory," Solid-State Electronics, vol. 50, Issue 6, Jun. 2006, pp. 924-928.

* cited by examiner

*Primary Examiner* — Hoai V Pham
(74) *Attorney, Agent, or Firm* — Cantor Colburn LLP; Ian MacKinnon

(57) ABSTRACT

A device includes a substrate; a shallow trench isolation (STI) region located in the substrate, the STI region comprising an STI material, and further comprising a recess in the STI material, the recess having a bottom and sides; a floating gate, wherein a portion of the floating gate is located on a side of the recess in the STI region and is separated from the substrate by a portion of the STI material; and a gate dielectric layer located over the floating gate, and a control gate located over the gate dielectric layer, wherein a portion of the control gate is located in the recess.

9 Claims, 10 Drawing Sheets

NON-VOLATILE MEMORY DEVICE FORMED BY DUAL FLOATING GATE DEPOSIT

CROSS REFERENCE TO RELATED APPLICATION

This application is a divisional of U.S. application Ser. No. 13/456,456 (Dornel et al.), filed on Apr. 26, 2012, which is herein incorporated by reference in its entirety.

BACKGROUND

This disclosure relates generally to the field of semiconductor memory devices, and more particular to a non-volatile memory (NVM) device formed by a dual floating gate deposit.

NVM devices are used in various types of computer memory, for example, flash devices. An NVM device includes a floating gate separated from a control gate by a gate oxide layer. A major concern in NVM devices is the gate coupling factor. A high gate coupling factor results in good control of the floating gate by the control gate during device operation and increases NVM device performance. The gate coupling factor of a NVM device is dependent on both the capacitance between the control gate and the floating gate, and the capacitance between the floating gate and the substrate. For an increase of 1 volt (V) of the control gate potential, the floating gate potential increases by a factor $\alpha_{CG}$, which is a factor related to the coupling factor between the floating gate and the control gate. $\alpha_{CG}$ needs to be relatively low to ensure good control of the floating gate by the control gate during device operation. However, capacitance that exists between the floating gate and the device substrate may act to raise $\alpha_{CG}$. Therefore, in order to raise the gate coupling factor of a NVM device, the capacitance between the control gate and the floating gate needs to be raised and/or the capacitance between the substrate and the floating gate needs to be lowered.

One way to increase the capacitance between the floating gate and the control gate is to decrease the equivalent oxide thickness (EOT) of the gate oxide located between the floating gate and control gate. However, if the gate oxide is made too thin, a tunneling current between the floating gate and control gate may arise, leading to the loss of data that is stored in the NVM device. Various floating gate shapes that are used in NVM devices to increase the capacitance between the floating gate and the control gate may also have the effect of increasing the capacitance between the floating gate and the substrate, which results in a relatively low net increase in the gate coupling factor of the device, and hence low increase in NVM device performance.

BRIEF SUMMARY

In one aspect, a device includes a substrate; a shallow trench isolation (STI) region located in the substrate, the STI region comprising an STI material, and further comprising a recess in the STI material, the recess having a bottom and sides; a floating gate, wherein a portion of the floating gate is located on a side of the recess in the STI region and is separated from the substrate by a portion of the STI material; and a gate dielectric layer located over the floating gate, and a control gate located over the gate dielectric layer, wherein a portion of the control gate is located in the recess.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a NVM device formed by a dual floating gate deposit, and a method of forming a NVM device by a dual floating gate deposit, are provided, with exemplary embodiments being discussed below in detail. The dual floating gate deposit forms a floating gate that extends into a recess in the STI region. The control gate also extends into the recess in the STI region. This results in relatively high capacitance between the floating gate and the control gate. The portion of the floating gate that is located in the recess is separated from the substrate by a relatively thick portion of the STI region that surrounds the recess, which results in a relatively low capacitance between the substrate and the floating gate. The overall coupling factor and performance of the NVM device are thereby increased.

The dual floating gate deposit comprises two floating gate deposition steps. After a first deposition and patterning of floating gate material (e.g., polysilicon, or a metal such as titanium nitride (TiN), titanium aluminum nitride (TiAlN), or tantalum nitride (TaN)), an exposed surface of the STI is etched anisotropically, using the patterned floating gate material as a mask, to form a recess in the STI. The STI recess etch is performed to control the amount of STI material remaining in the sides of the STI adjacent to the substrate after the recess etch, which controls the distance between the finished floating gate and the substrate. A relatively high distance between the substrate and the floating gate results in a relatively low capacitance between the floating gate and the substrate. Use of the STI area achieves a relatively low floating gate-substrate capacitance, which allows the coupling factor between floating gate and control gate to be increased without increasing the NVM device area. After the recess is formed, a second floating gate material deposit, comprising conformal deposition of floating gate material over the patterned floating gate material and in the recess, followed by an anisotropic etch, is performed. This second deposition and etch of the floating gate material is self-aligned to the floating gate material deposited by the first floating gate deposition step.

Figure 1:
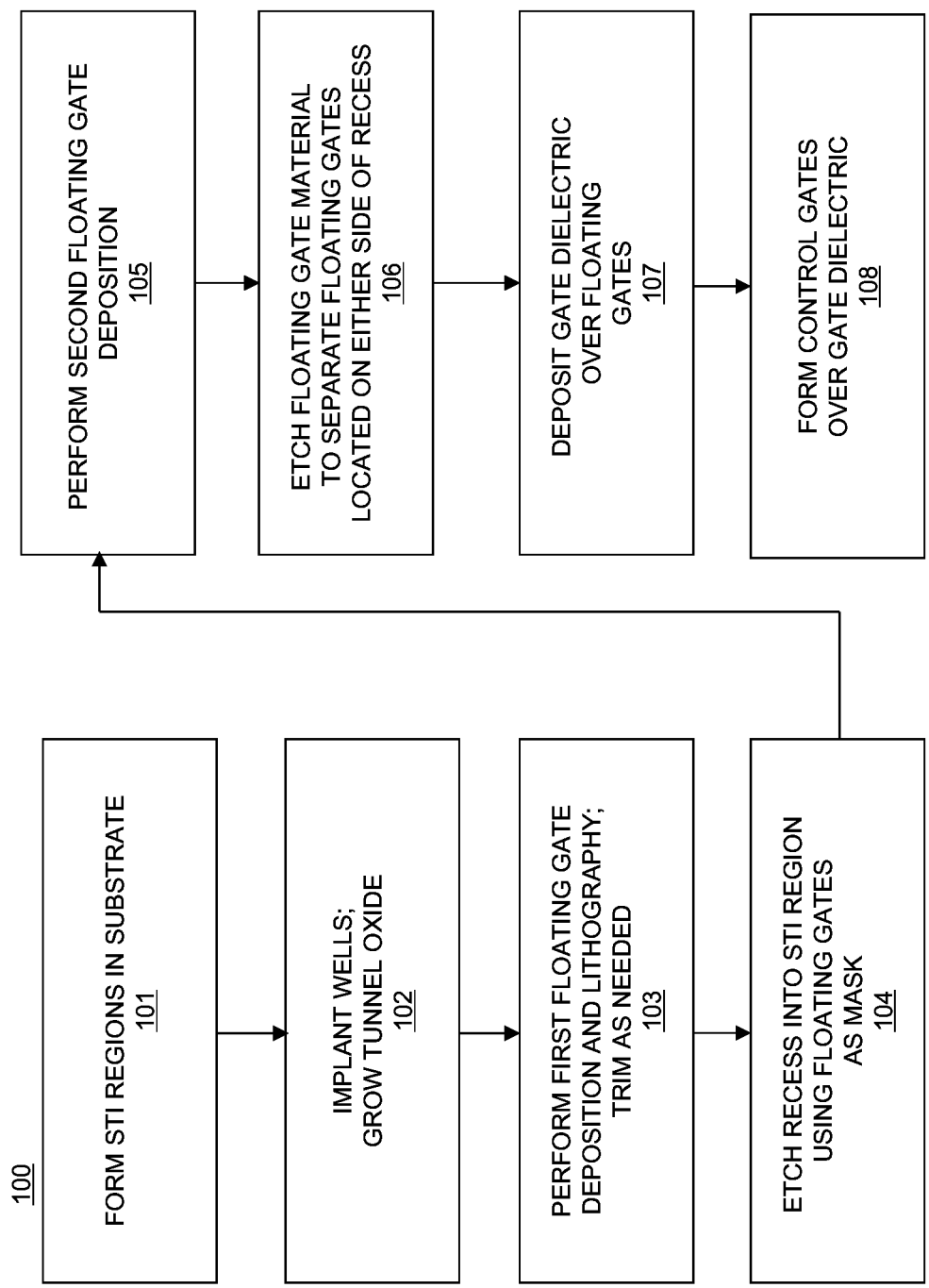
FIG. 1 illustrates a flowchart of an embodiment of a method of forming a NVM device by a dual floating gate deposit.
Figure 2:
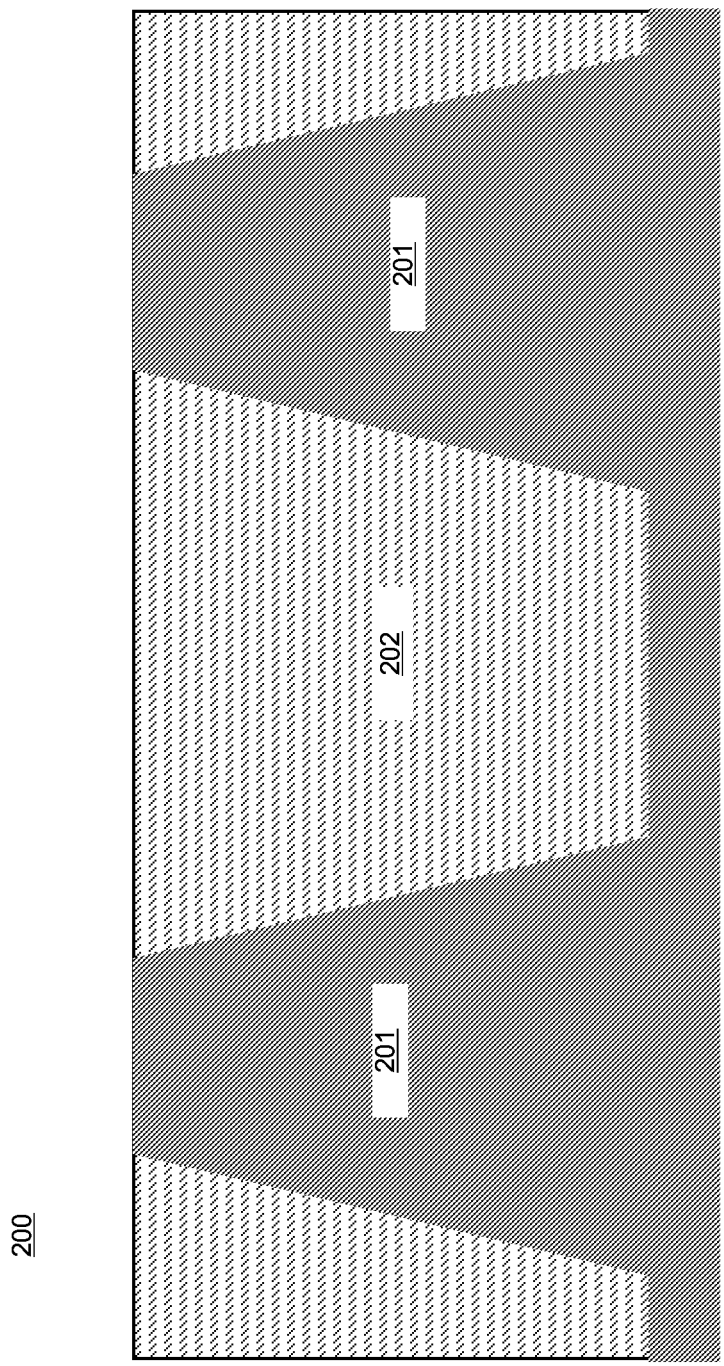
FIG. 2 is a cross sectional view illustrating an embodiment of a substrate after formation of a shallow trench isolation (STI) region.

FIG. 1 shows a flowchart of an embodiment of a method 100 of forming a NVM device by a dual floating gate deposit. FIG. 1 is discussed with respect to FIGS. 1-10. First, in block 101 on FIG. 1, an STI region is formed in a wafer comprising a silicon substrate. The STI region may be formed by any appropriate method, and may include an oxide liner and an oxide fill. In some embodiments, the STI region may be formed to additionally include an etch stop layer as is described in "Non-Volatile Memory Device Formed with an Etch Stop Layer in the Shallow Trench Isolation (STI) Regions", Ser. No. 13/456,471 (Dornel), which is herein incorporated by reference in its entirety. FIG. 2 shows an embodiment of a device 200 including a silicon substrate 201 after formation of an STI region 202 in the silicon substrate 201. STI region 202 may include an oxide liner and an oxide fill, and may additionally include an etch stop layer in some embodiments.

Figure 3:
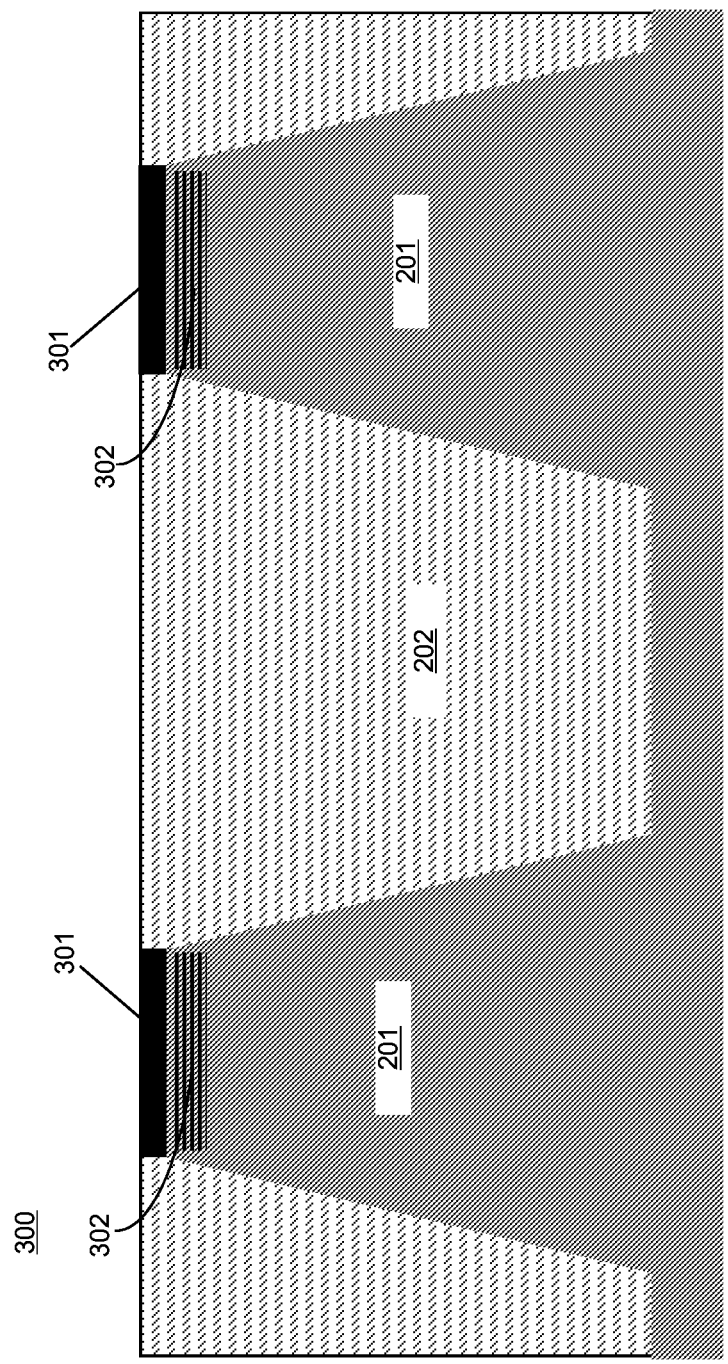
FIG. 3 is a cross sectional view illustrating an embodiment of a device after well implantation and tunnel oxide growth.

Next, returning to method 100 of FIG. 1, in block 102, well implantation and tunnel oxide growth is performed. The well implantation forms active regions in the silicon substrate near the top surface of the silicon substrate, and the tunnel oxide is then grown over the implanted well regions of the silicon substrate. The well region implantation and the tunnel oxide growth may be performed by any appropriate method. For example, the tunnel oxide may be grown by chemical vapor deposition (CVD) or in-situ steam generation (ISSG) in various embodiments. The tunnel oxide may comprise a high k dielectric such as hafnium oxide ($HfO_2$), hafnium silicate ($HfSiO_2$), nitrided hafnium silicate (HfSiON), silicon oxinitride ($SiO_xN_y$), silicon nitride ($Si_3N_4$), or aluminum oxide ($Al_2O_3$). FIG. 3 shows the device 200 of FIG. 2 after implantation of well regions 302 in the silicon substrate 201, and after growth of tunnel oxide 301 over the well regions 302.

Figure 4:
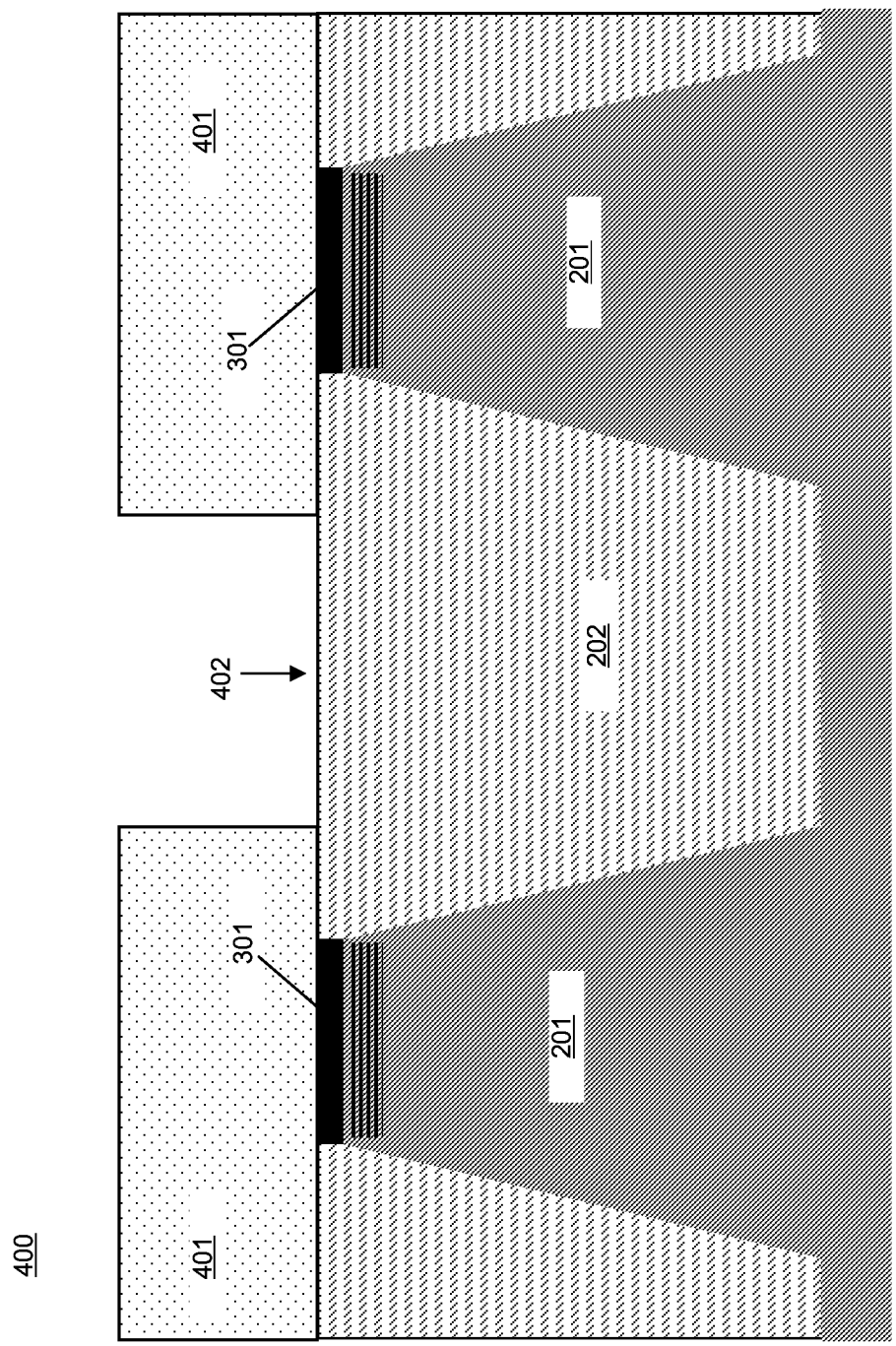
FIG. 4 is a cross sectional view illustrating an embodiment of a device after a first floating gate material deposition step.

Returning again to FIG. 1, flow proceeds to block 103, in which the first floating gate deposition step is performed. The floating gate material that is deposited during block 103 is formed such that the floating gate material overlaps with the STI region while leaving a portion of the top surface of the STI region exposed. The floating gate material may comprise polysilicon or a metal such as TiN, TiAlN, or TaN; or may be composed of several layers such as a polysilicon layer on top of metal layers. Deposition of the floating gate material may be followed by a lithography step. In some embodiments, block 103 may include an optional etching step after the lithography step; the optional etching step may be performed to trim the deposited floating gate material, controlling the area of the top surface of the STI region that is exposed. FIG. 4 shows the device 300 of FIG. 3 after deposition, lithography, and an optional trimming etch of the floating gate material to form first floating gate regions 401. Top surface 402 of the STI region 202 is exposed between the first floating gate regions 401; the lithography and optional trimming steps are performed to adjust the amount of the top surface 402 of the STI region 202 that is exposed. The first floating gate regions 401 are located on top of tunnel oxide 303 and overlap the STI region 202.

Figure 5A:
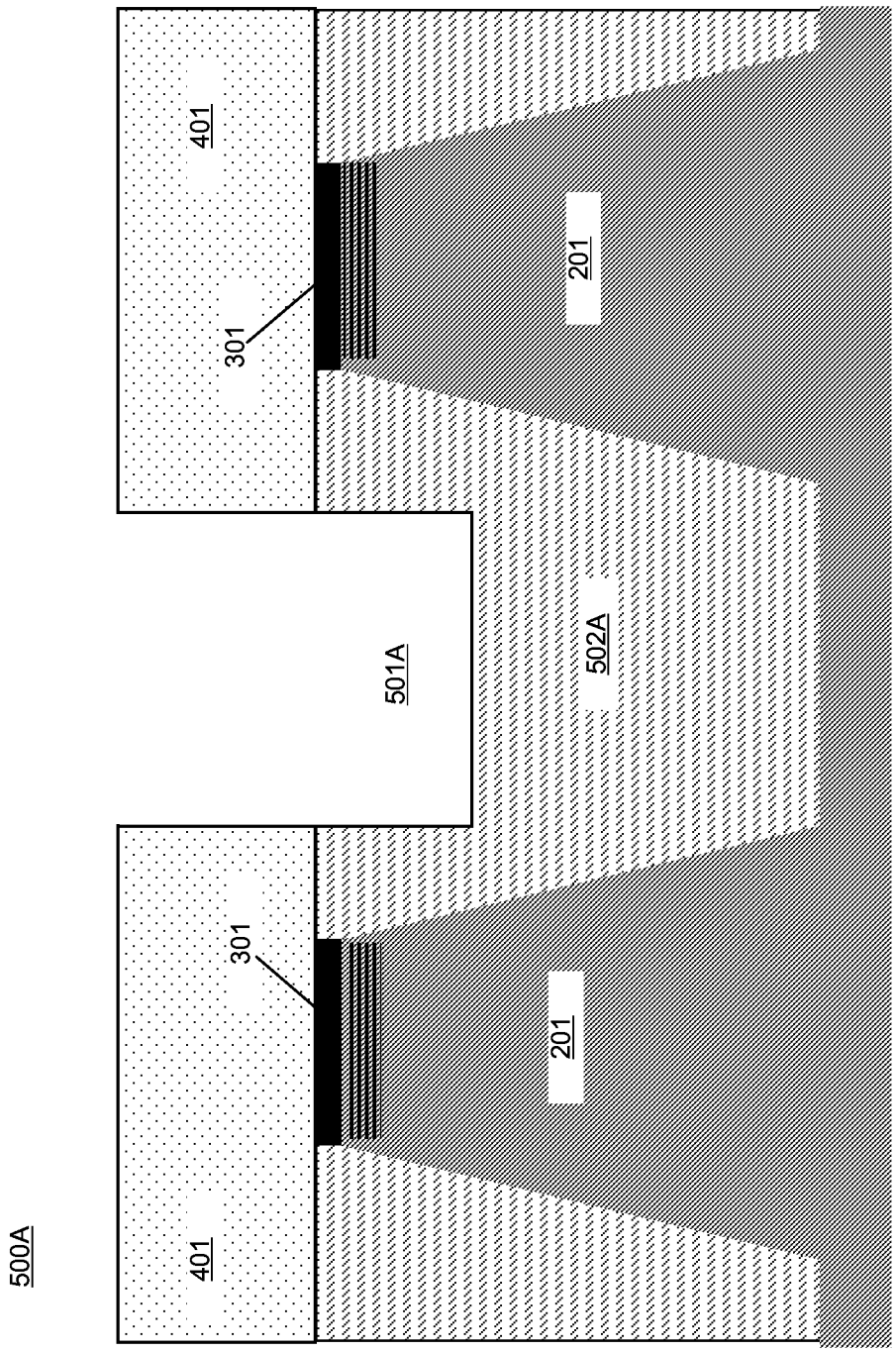
FIGS. 5A-B are a cross sectional view illustrating an embodiment of a device after etching of a recess the STI region.
Figure 5B:
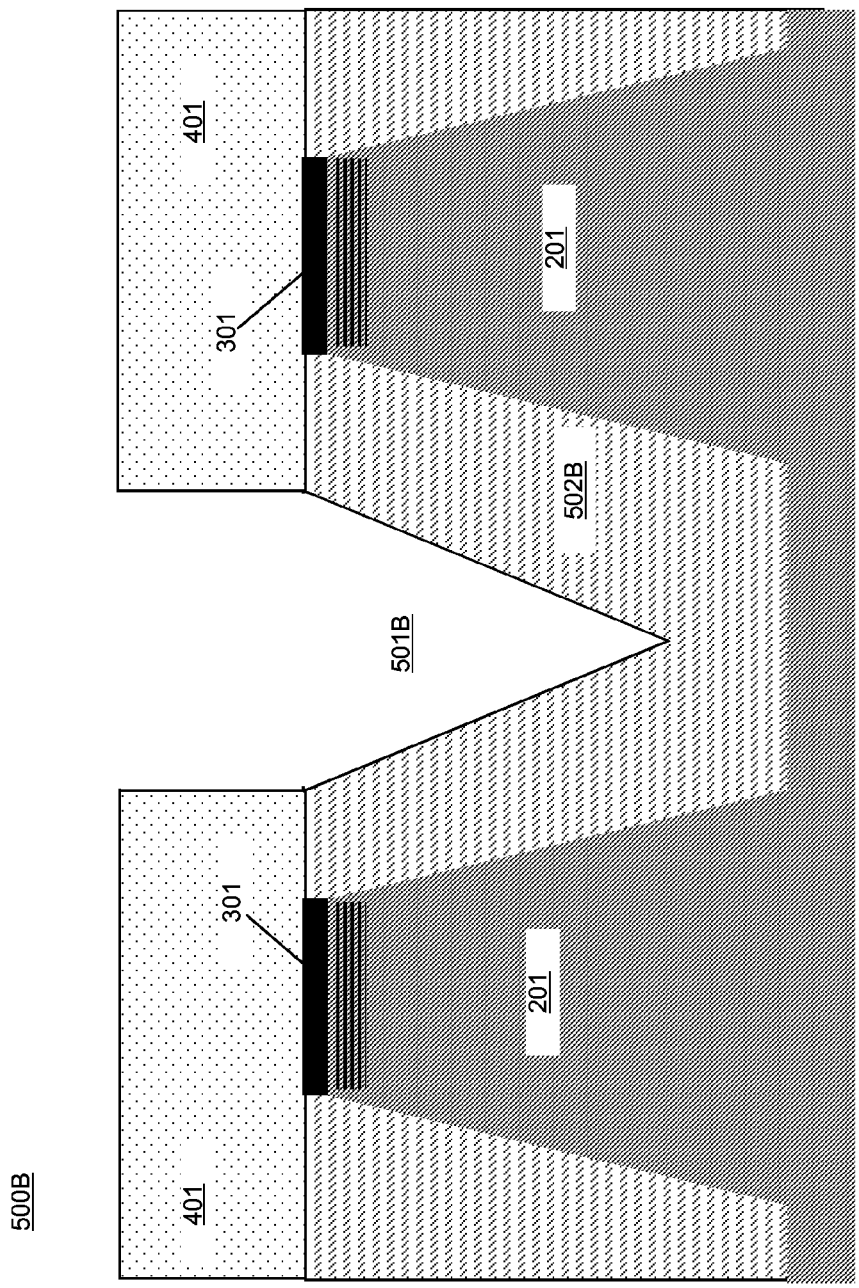

Flow of method 100 of FIG. 1 now proceeds to block 104, in which a recess is etched in the STI region. The recess may be etched in the STI region by an anisotropic oxide etch such as a plasma etch, and more particularly reactive ion etching (RIE), such that the deposited floating gate material is not affected. The depth of the recess may be from about one-third to about two-thirds of the depth of the STI region in some embodiments. The depth of the recess may be controlled by the time of the etch in some embodiments, or in other embodiments in which the STI region includes an etch stop layer, the depth and shape of the recess is controlled by the location and thickness of the etch stop layer. In some embodiments, the sides of the recess may be vertical, or in other embodiments the sides of the recess may be sloped. In embodiments in which the sides of the recess are sloped, the etch chemistry of the recess etch may include a fluorocarbon gas, such as tetrafluoromethane ($CF_4$), octofluoropropane ($C_3F_8$), or hexafluorobutadiene ($C_4F_6$), and the angle of the slope may be about 10 degrees. A recess with sloped sides may help to prevent formation of voids during deposition of the control gate (discussed below with respect to block 108 and FIG. 9). The amount of the STI region that remains after the recess etch determines the capacitance between the floating gate and the substrate in the finished NVM device. FIGS. 5A-B show the device 400 of FIG. 4 after etching various embodiments of a recess 501A/501B in the STI region 202. First floating gate regions 401 act as a mask during the etch of the recess 501A/501B. Recess 501A as shown in FIG. 5A has vertical sides, and recess 501B as shown in FIG. 5B has sloped sides. The depth and shape of the recesses 501A/501B is dependent on the etch chemistry used in the recess etch; a recess in an STI region such as STI region 202 may have any appropriate depth and shape in various embodiments. Additionally, while FIGS. 6-9, which illustrate further processing steps of method 100 of FIG. 1, are shown with respect to an example device 500A including recess 501A with vertical sides, the same processing steps may be applied to the device 500B including recess 501B to form a NVM device in various embodiments. A NVM that includes a recess such as recess 501B having sloped sides may help to prevent void formation during deposition of the control gate. The remaining STI region 502A/502B that surrounds the recess 501A/501B may be relatively thick, as the remaining STI region 502A/502B determines the distance between the floating gate and the silicon substrate 201 in the finished NVM device.

Figure 6:
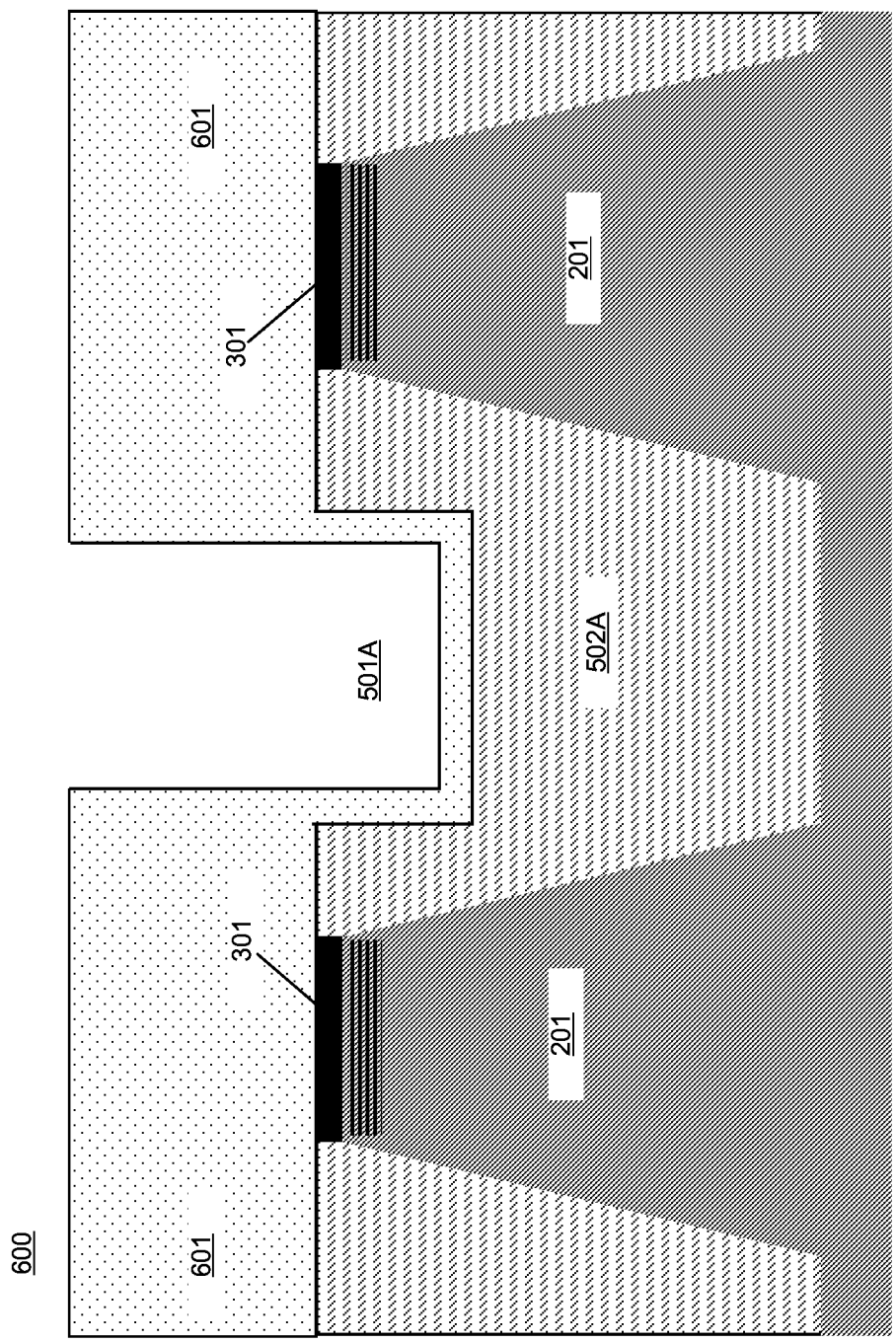
FIG. 6 is a cross sectional view illustrating an embodiment of a device after a second floating gate material deposition step.

Turning again to method 100 of FIG. 1, in block 105, a second floating gate deposition step is performed. The second floating gate deposition step comprises conformal deposition of the floating gate material, which may be polysilicon or a metal such as TiN, TiAlN, or TaN, and causes a layer of the floating gate material to form over the sides and bottom of the recess in the STI region, in addition to thickening the floating gate regions that were formed by the first floating gate deposition step. Additionally, in some embodiments, the sides of the floating gate regions may be implanted with dopants after deposition. The implantation may comprise tilted implantation in some embodiments. FIG. 6 shows the device 500A of FIG. 5A after a second floating gate deposition step to form floating gate region 601. Floating gate region 601 comprises polysilicon or a metal such as TiN, TiAlN, or TaN, and extends into the STI region 202, covering the sides and bottom of the recess 501A.

Figure 7:
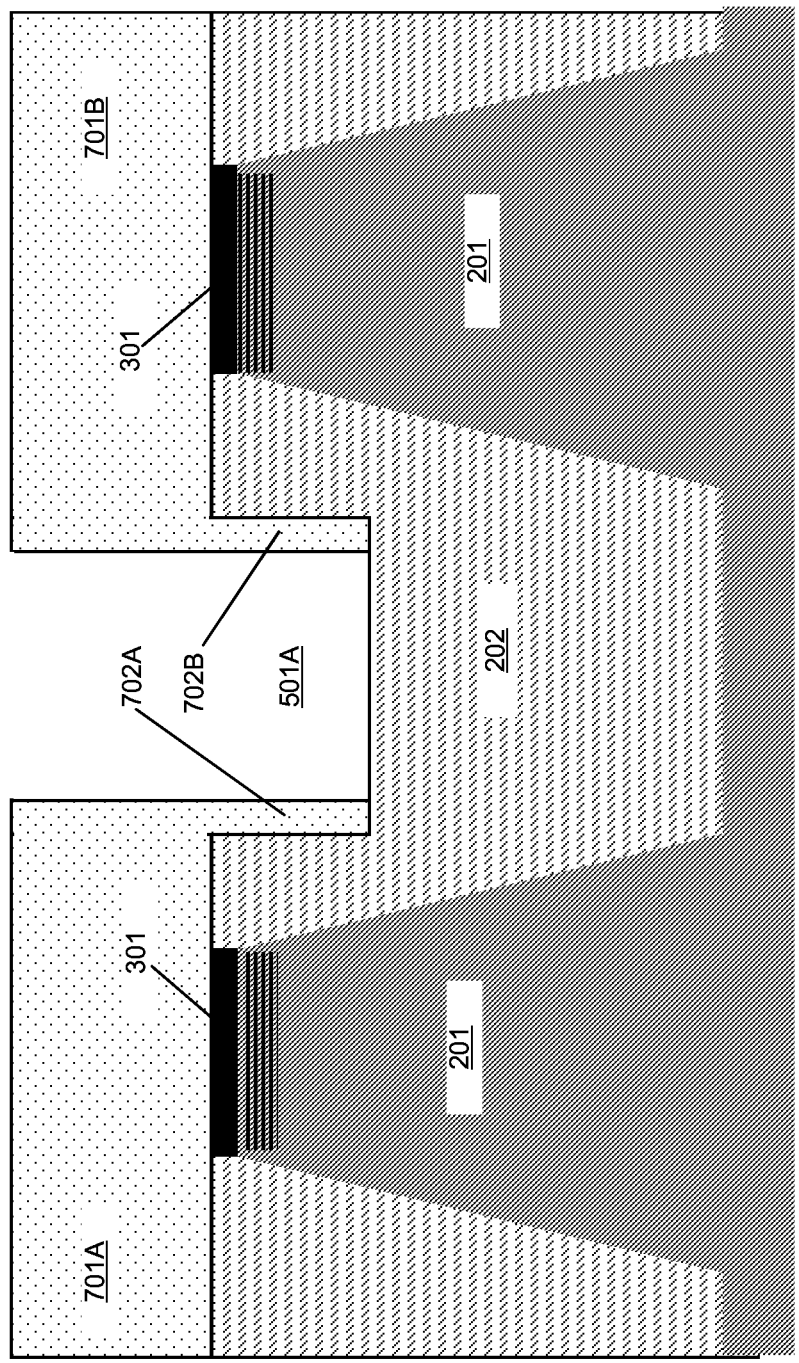
FIG. 7 is a cross sectional view illustrating an embodiment of a device after etching the floating gate material to form the floating gates.

Flow of method 100 of FIG. 1 then proceeds to block 106, in which the floating gate region is etched to form separate floating gates on either side of the recess in the STI region. The etch removes a portion of the floating gate region that is located at the bottom of the recess, and also reduces the thickness of the floating gates to approximately the same thickness as the floating gate regions that were formed by the first deposition step. The etch performed in block 106 may include an anisotropic etch that is selective to oxide. FIG. 7 shows the device 600 of FIG. 6 after etching of the floating gate region 601 of FIG. 6 to form floating gates 701A-B, which are electrically disconnected from one another, due to removal of the floating gate material that was located at the bottom of recess 501A by the etch. In addition, after the etch, the floating gates 701A and 701B have approximately the same thickness as the first floating gate regions 401 that were shown in FIG. 4. Each of floating gates 701A-B comprise a portion 702A-B that extends into the recess 501A in the STI region 202; these portions of floating gates 701A-B are separated from substrate 201 by the remaining STI region 502A.

Figure 8:
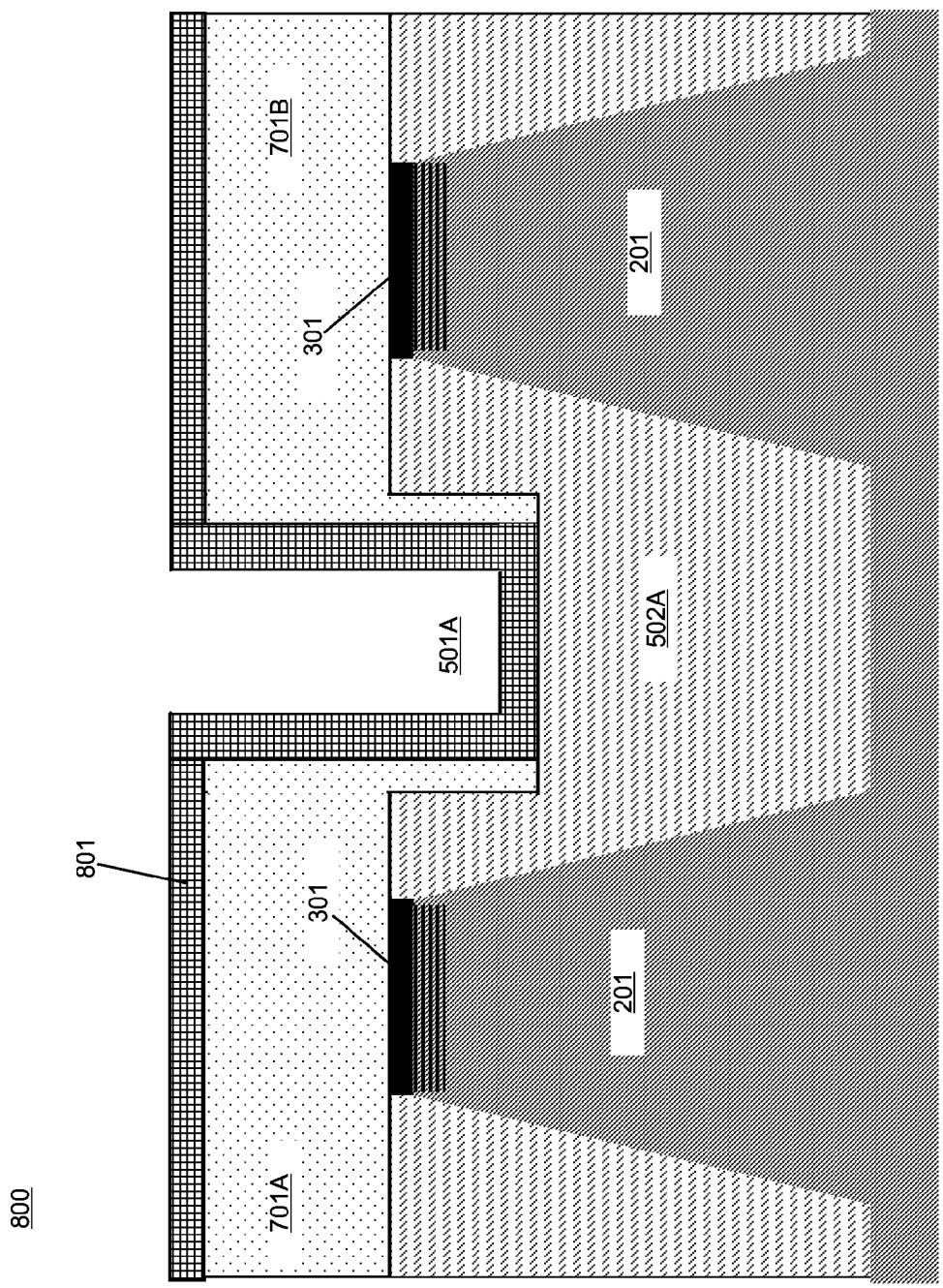
FIG. 8 is a cross sectional view illustrating an embodiment of a device after deposition of the gate dielectric.

Returning to method 100 of FIG. 1, in block 107, a gate dielectric layer is deposited over the device, covering the floating gates 701A-B and the bottom of the recess 501A. The gate dielectric layer is formed by conformal deposition, and may include one or more layers of oxide and/or nitride. The gate dielectric layer may comprise a high k dielectric such as $HfO_2$, hafnium silicate ($HfSiO_2$) nitrided hafnium silicate (HfSiON), silicon oxinitride ($SiO_xN_y$), silicon nitride ($Si_3N_4$) or aluminum oxide ($Al_2O_3$) in some embodiments. Additionally, in some embodiments, the gate dielectric layer may include an oxide-nitride-oxide (ONO) dielectric layer. FIG. 8 shows the device 700 of FIG. 7 after formation of the gate dielectric layer 801 over the floating gates 701A-B and the bottom of recess 501A.

Figure 9:
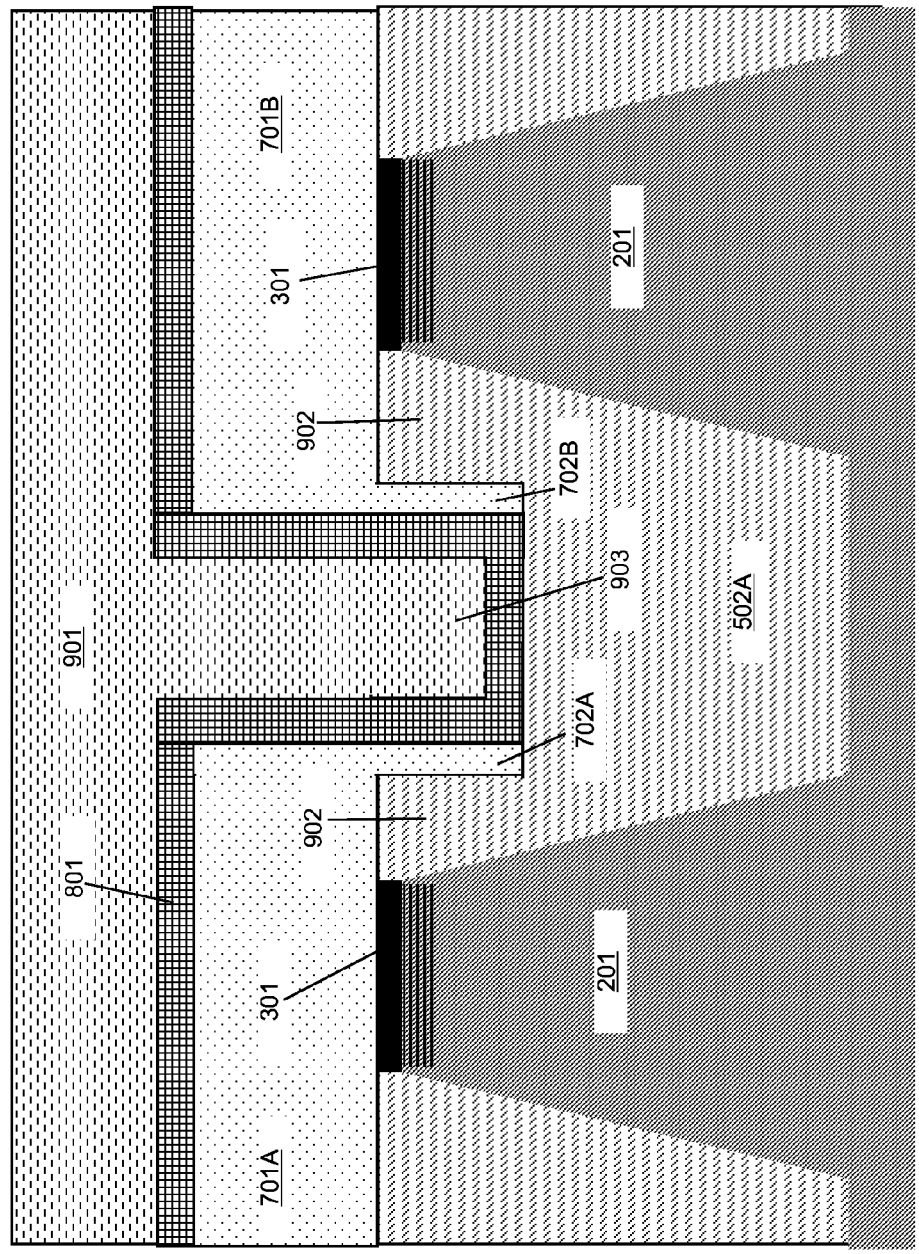
FIG. 9 is a cross sectional view illustrating an embodiment of a device after formation of the control gate.

Lastly, the flow of method 100 of FIG. 1 proceeds to block 108, in which the control gate is formed over the gate dielectric layer. The control gate may comprise polysilicon or a metal such as TiN, TiAlN, or TaN, and may be deposited using any appropriate method of deposition. The control gate is separated from the floating gates by the gate dielectric layer. Both the floating gates and the control gate extend into the recess in the STI. FIG. 9 shows the device 800 after formation of a control gate 901 to form NVM device 900. As shown in FIG. 9, both the control gate 901 (i.e., portion 903) and the floating gates 701A-B (i.e., portions 702A-B) extend into the remaining STI region 502A, which raises the capacitance between the floating gates 701A-B and the control gate 901. Further, a portion 902 of the remaining STI region 502A (which may comprise oxide fill or an etch stop layer in various embodiments) separates portions 702A-B of floating gates 701A-B from the substrate 201 and thereby reduces the capacitance between the floating gates 701A-B and the substrate 201. In order to reduce the capacitance between the floating gates 701A-B and the substrate 201, the thickness of the portion 902 of the remaining STI region 502A between the floating gates 701A-B and the substrate 201 may be greater than a thickness of the tunnel oxide layer 301. This results in a relatively high gate coupling factor for NVM device 900.

The technical effects and benefits of exemplary embodiments include formation of a NVM memory device having a relatively high gate coupling factor by a self-aligned, dual floating gate deposit process.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A device, comprising:
    a substrate;
    a shallow trench isolation (STI) region located in the substrate, the STI region comprising an STI material, and further comprising a recess in the STI material, the recess having a bottom and sides;
    a floating gate, wherein a portion of the floating gate is located on a side of the recess in the STI region and is separated from the substrate by a portion of the STI material; and
    a gate dielectric layer located over the floating gate, and a control gate located over the gate dielectric layer, wherein a portion of the control gate is located in the recess.

2. The device of claim 1, further comprising a tunnel oxide layer located underneath the floating gate on the substrate, wherein a thickness of the STI material that is located between the floating gate and the substrate is thicker than a thickness of the tunnel oxide layer.

3. The device of claim 1, wherein the gate dielectric layer is located directly on the bottom of the recess.

4. The device of claim 1, wherein the floating gate comprises one of polysilicon, titanium nitride (TiN), titanium aluminum nitride (TiAlN), and tantalum nitride (TaN), and the substrate comprises a silicon substrate.

5. The device of claim 1, wherein the STI material comprises an oxide fill and an etch stop layer.

6. The device of claim 5, wherein the floating gate is located directly on the etch stop layer.

7. The device of claim 1, wherein the sides of the recess are sloped.

8. The device of claim 7, wherein said sides have a slope of about 10 degrees.

9. The device of claim 1, wherein the recess has a depth in the STI region that is from about one-third (⅓) to about two-thirds (⅔) of a depth of the STI region in the substrate.

* * * * *